(12) United States Patent
Jang

(10) Patent No.: US 6,204,969 B1
(45) Date of Patent: Mar. 20, 2001

(54) AMPLITUDE MASK, AND APPARATUS AND METHOD FOR MANUFACTURING LONG PERIOD GRATING FILTER USING THE SAME

(75) Inventor: Joo-nyung Jang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/207,584

(22) Filed: Dec. 8, 1998

(30) Foreign Application Priority Data

Dec. 8, 1997 (KR) .................................................. 97-66751

(51) Int. Cl.[7] .............................. G02B 6/34; G02B 5/18
(52) U.S. Cl. ...................... 359/570; 359/566; 359/577; 359/900; 385/37
(58) Field of Search ............................. 359/3, 8, 34, 35, 359/577, 566, 569, 570, 900; 385/37

(56) References Cited

U.S. PATENT DOCUMENTS

| | | | |
|---|---|---|---|
| 5,559,907 | * | 9/1996 | Innis et al. .............................. 385/37 |
| 5,604,829 | * | 2/1997 | Bruesselbach ........................ 385/37 |
| 5,619,603 | * | 4/1997 | Epworth et al. ....................... 385/37 |
| 5,620,495 | * | 4/1997 | Aspell et al. .......................... 385/123 |
| 5,830,622 | * | 11/1998 | Canning et al. ....................... 385/37 |
| 5,953,471 | * | 9/1999 | Espindola et al. .................... 385/37 |
| 6,067,391 | * | 5/2000 | Land ...................................... 385/37 |

FOREIGN PATENT DOCUMENTS

0978738 * 9/2000 (EP) .

OTHER PUBLICATIONS

S. J. Mihailov, et al. "Recording of Efficient High–Order Bragg Reflectors in Optical Fibres by Mask Image Projection and Single Pulse Exposure with an Excimer Laser". Electronics Lett. vol. 30, No. 9, pp. 707–709, Apr. 1994.*

L. Zhang, et al., "Design adn Realization of Long–Period Grating Devices in Conventional and High Birefringence Fibers and Their Novel Applications as Fiber–Optic Load Sensors"., IEEE J. Selected Topics in Quantum Electronics, vol. 5, No. 5, pp 1373–1378, Apr. 1994.*

* cited by examiner

Primary Examiner—Cassandra Spyrou
Assistant Examiner—John Juba, Jr.
(74) Attorney, Agent, or Firm—Robert E. Bushnell, Esq.

(57) ABSTRACT

An amplitude mask, and an apparatus and method for manufacturing a long period grating filter using the same, are provided. When a long period grating is manufactured by selectively passing laser light to an optical fiber, the amplitude mask periodically passes laser light to the optical fiber. The amplitude mask includes two masks having periodically alternating pass areas for passing the laser light and nonpass areas for preventing passing of the laser light, the two masks being continuously rotated in opposite directions. The period of the pass area thus continuously changes. In this mask, two masks each having a predetermined period are rotated in opposite directions, to thus provide an amplitude mask period depending on the angle of rotation. Thus, the period of the amplitude mask can be continuously changed.

9 Claims, 6 Drawing Sheets

AMPLITUDE MASK, AND APPARATUS AND METHOD FOR MANUFACTURING LONG PERIOD GRATING FILTER USING THE SAME

CLAIM OF PRIORITY

This application makes reference to, incorporates the same herein, and claims all benefits accruing under 35 U.S.C. § 119 from an application for AMPLITUDE MASK, AND APPARATUS AND METHOD FOR MANUFACTURING LONG PERIOD GRATING FILTER USING THE SAME earlier filed in the Korean Industrial Property Office on Dec. 8, 1997 and there duly assigned Serial No. 66751/1997.

BACKGROUND OF THE INVENTION

1. Field of the Invention

The present invention relates to an optical passive element, and more particularly, to an amplitude mask and an apparatus and method for manufacturing a long period grating filter using the same.

2. Description of the Related Art

With the recent developments in optical communications, a long period grating filter used as an optical passive element is attracting much attention. The long period grating filter couples a core mode in which light travels through the core of an optical fiber to a cladding mode, and is manufactured by periodically changing the refractive index of the core of an optical fiber sensitive to ultraviolet rays. That is, the refractive index of a portion exposed to light increases, and that of a non-exposed portion does not change, thus a periodic change in refractive index is generated. In order to couple the core mode to the cladding mode, the following Equation 1 must be satisfied:

$$\beta_{co} - \beta_{cl}^n = \frac{2\pi}{\Lambda} \quad (1)$$

wherein $\beta_{co}$ is the propagation constant of the core mode, $\beta hd\ cl^n$ is the propagation constant of an n-th order cladding mode, and $\Lambda$ is a grating period.

When $2\pi m/\lambda$ (here, n is a refractive index) is substituted for $\beta$ in Equation 1, Equation 1 becomes $n_{co}-n_{cl}=\lambda/\Lambda$. Accordingly, the period $\Lambda$ and the refractive index difference $(n_{co}-n_{cl})$ must be determined to couple a certain wavelength to the cladding mode. The refractive index difference can be obtained by appropriately irradiating ultraviolet laser light to an optical fiber that is sensitive to ultraviolet rays.

An earlier long period grating filter manufacturing apparatus comprises a high-output excimer laser optical source, a mirror, a lens, a silica mask, and an optical fiber. The optical source emits ultraviolet laser light. The mirror changes the path of laser light emitted by the optical source. The lens adjusts the focus of laser light whose path has been changed by the mirror. The silica mask selectively passes the laser light passed through the lens. The optical fiber has a core in which a long period grating is formed by being irradiated by the laser light passed through the silica mask to the optical fiber.

When the laser light passes through the lens and is irradiated upon the optical fiber contacting the silica mask, the refractive index of the optical fiber changes at regular periods, and the long period grating is formed on the optical fiber. Light is passed through the optical fiber using an optical source and is detected by a detector, and thus the optical characteristics of the long period grating filter are obtained.

In the long period grating filter manufacturing apparatus described above, the silica mask is comprised of chrome patterns obtained by coating and patterning chromium Cr on a silica substrate. The laser light is selectively passed by these chrome patterns. However, the chrome pattern has a damage threshold of 100 mJ/cm$^2$, which makes it impossible to effectively use a high-output excimer laser light. Also, the silica mask is manufactured by forming the chrome patterns on the silica substrate, and thus has only one period which is determined by an initially designed pattern. Therefore, amplitude masks having different periods are required in order to obtain long period grating filters having different periods, thereby increasing manufacturing costs.

SUMMARY OF THE INVENTION

To solve the above problems, it is an object of the present invention to provide an amplitude mask which is comprised of two coupled masks each having a regular period and whose period is consecutively changed by rotating the two masks in opposite directions a predetermined amount, and an apparatus and method for manufacturing a long period grating filter using the same.

Accordingly, to achieve the above object, there is provided an amplitude mask for periodically passing laser light to an optical fiber when a long period grating is manufactured by selectively passing the laser light to the optical fiber, comprising: two masks having periodically alternating pass areas for passing the laser light and nonpass areas for preventing passing of the laser light, wherein the two masks are continuously rotated in opposite directions, and the period of the pass area thus continuously changes.

To achieve the above object, there is provided a long period grating filter manufacturing apparatus comprising: a laser optical source for emitting laser light; an amplitude mask portion whose period is controlled by overlapping two masks each having a predetermined period and rotating the two overlapped masks a predetermined angle, and which selectively passes the laser light to an optical fiber in which a long period grating is to be formed, according to the controlled period; and a rotation means for rotating the two masks a predetermined angle in opposite directions.

To achieve the above object, there is provided a long period grating filter manufacturing apparatus comprising: a laser optical source; a mirror for changing the path of laser light emitted by the laser optical source; a lens for adjusting the focus of laser light whose path has been changed; an amplitude mask portion whose period is controlled by overlapping two masks each having a predetermined period and rotating the two overlapped masks a predetermined angle, and which selectively passes the laser light passed through the lens to an optical fiber in which a long period grating is to be formed, according to the controlled period; a detector for detecting a coupling peak of a long period grating filter formed on the optical fiber; and a controller for controlling the period of the amplitude mask to obtain a desired coupling peak wavelength by receiving a wavelength at the coupling peak from the detector.

To achieve the above object, there is provided a method of manufacturing a long period grating filter, comprising the steps of: overlapping two masks in each of which pass regions passed by laser light alternate with non-pass regions, and rotating the two masks in opposite directions; irradiating the laser light to an optical fiber via the pass regions formed at predetermined periods in the two rotated masks and forming a long period grating on the optical fiber; and measuring a coupling peak due to the long period grating by passing light through the optical fiber on which the long period grating has been formed, and controlling the angle of rotation at which the two masks are rotated so that the measured coupling peak is achieved at a desired wavelength.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
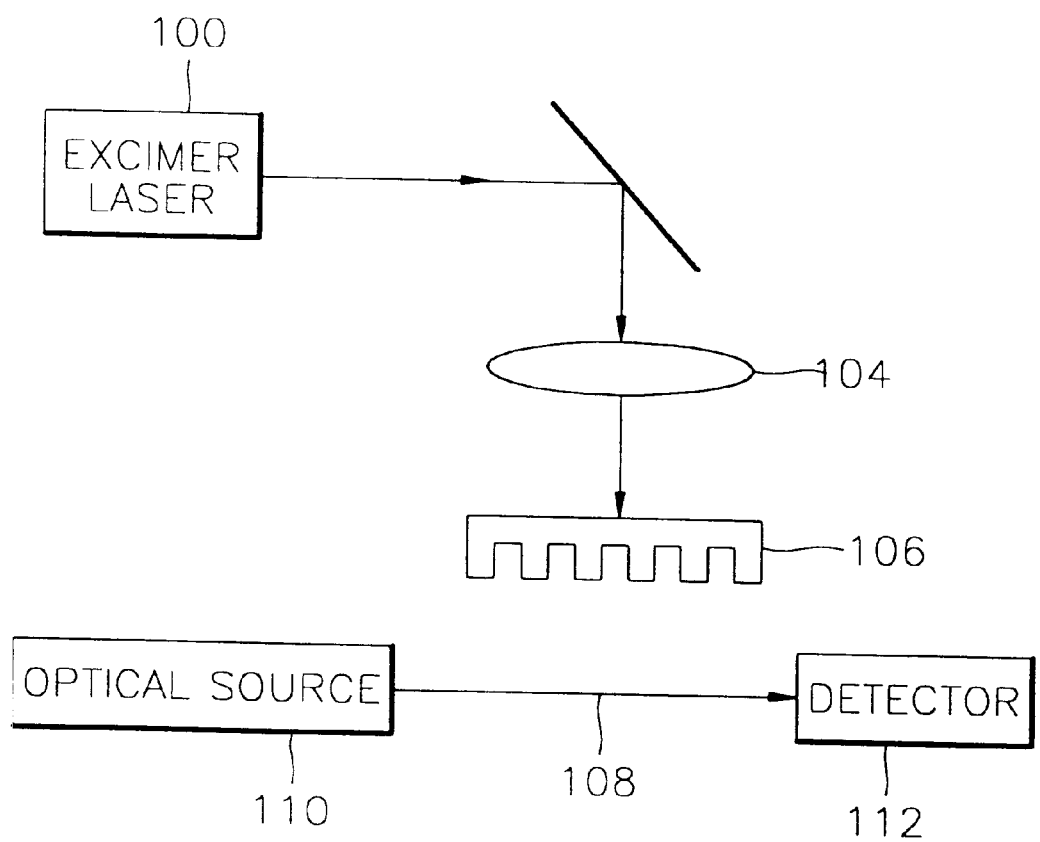
FIG. 1 is a block diagram schematically illustrating an earlier long period grating filter manufacturing apparatus.

FIG. 1 is a block diagram of the long period grating filter manufacturing apparatus discussed in the Description of the Related Art above.

A high-output excimer laser optical source 100 emits ultraviolet laser light to a mirror 102 which reflects the light through a lens 104 and a silica mask 106 so as to impinge upon an optical fiber 108. The mirror 102 changes the path of the laser light emitted by the optical source 100 and the lens 104 adjust the focus of the laser light whose path has been changed by the mirror 102. The silica mask 106 selectively passes the laser light passed through the lens 104 and the optical fiber 108 has a core in which a long period grating is formed by being irradiated by the laser light passed through the silica mask 106 to the optical fiber.

When the laser light passes through the lens 104 and is irradiated upon the optical fiber 108 contacting the silica mask 106, the refractive index of the optical fiber 108 changes at regular periods and the long period grating is formed on the optical fiber 108. Light is passed through the optical fiber 108 using an optical source 110 and is detected by a detector 112 and thus the optical characteristics of the long period grating filter are obtained.

Figure 2:
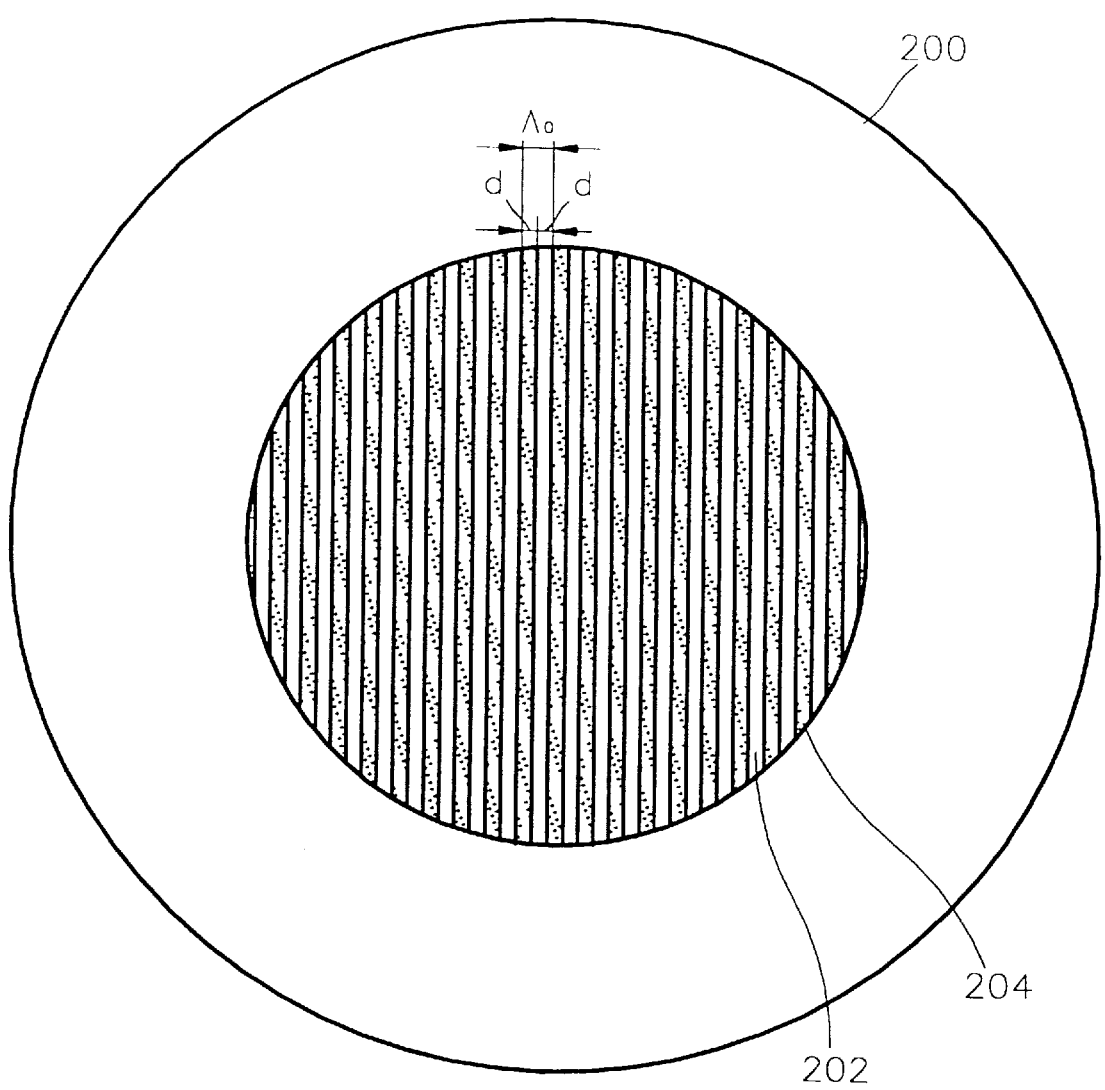
FIG. 2 illustrates the structure of a mask for forming the present invention.
Figure 3:
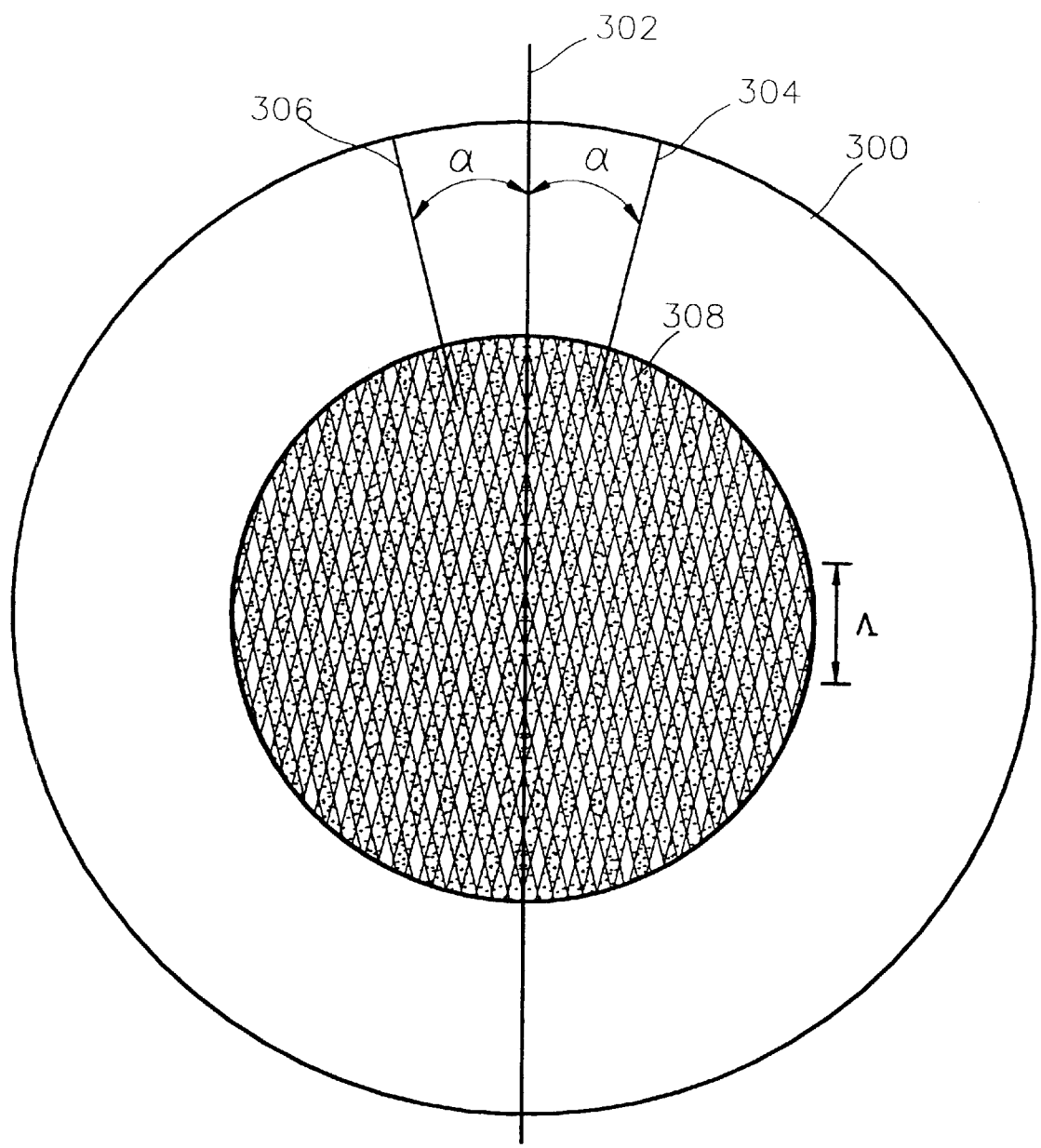
FIG. 3 illustrates the result of the two masks of FIG. 2 being rotated a predetermined angle in different directions to obtain a desired period.

FIG. 2 shows the structure of a mask for forming the present invention. FIG. 3 shows the result of the two masks of FIG. 2 being rotated a predetermined angle in opposite directions to obtain a desired period. The mask of FIG. 2 is comprised of pass areas 202 for passing light at periods ($\Lambda_0$=2d) of hundreds of $\mu$m and non-pass areas 204 on a thin metal substrate 200 of about 0.2 mm thick, i.e., a stainless substrate. The pass region 202 is formed by carbon dioxide laser lithography or chemical etching. The metal substrate 200 removes restrictions placed by a damage threshold, enabling use of a high power ultraviolet laser as an optical source. Laser passes through the pass area 202, thus increasing the refractive index of an optical waveguide. The non-pass area 204, being a metal portion, blocks ultraviolet laser.

In the present invention, an amplitude mask is comprised of two masks of FIG. 2 which are fixed, being overlapped on a rotation jig (not shown), and then each accurately rotated. FIG. 3 shows two masks 300 rotated by $\alpha°$. Here, reference numeral 302 is the direction of an optical fiber or an optical waveguide, reference numerals 304 and 306 represent first and second substrates each rotated by $\alpha°$, reference numeral 308 represents the region for passing laser, and $\Lambda$ represents the period of the amplitude mask according to the present invention.

Figure 4:
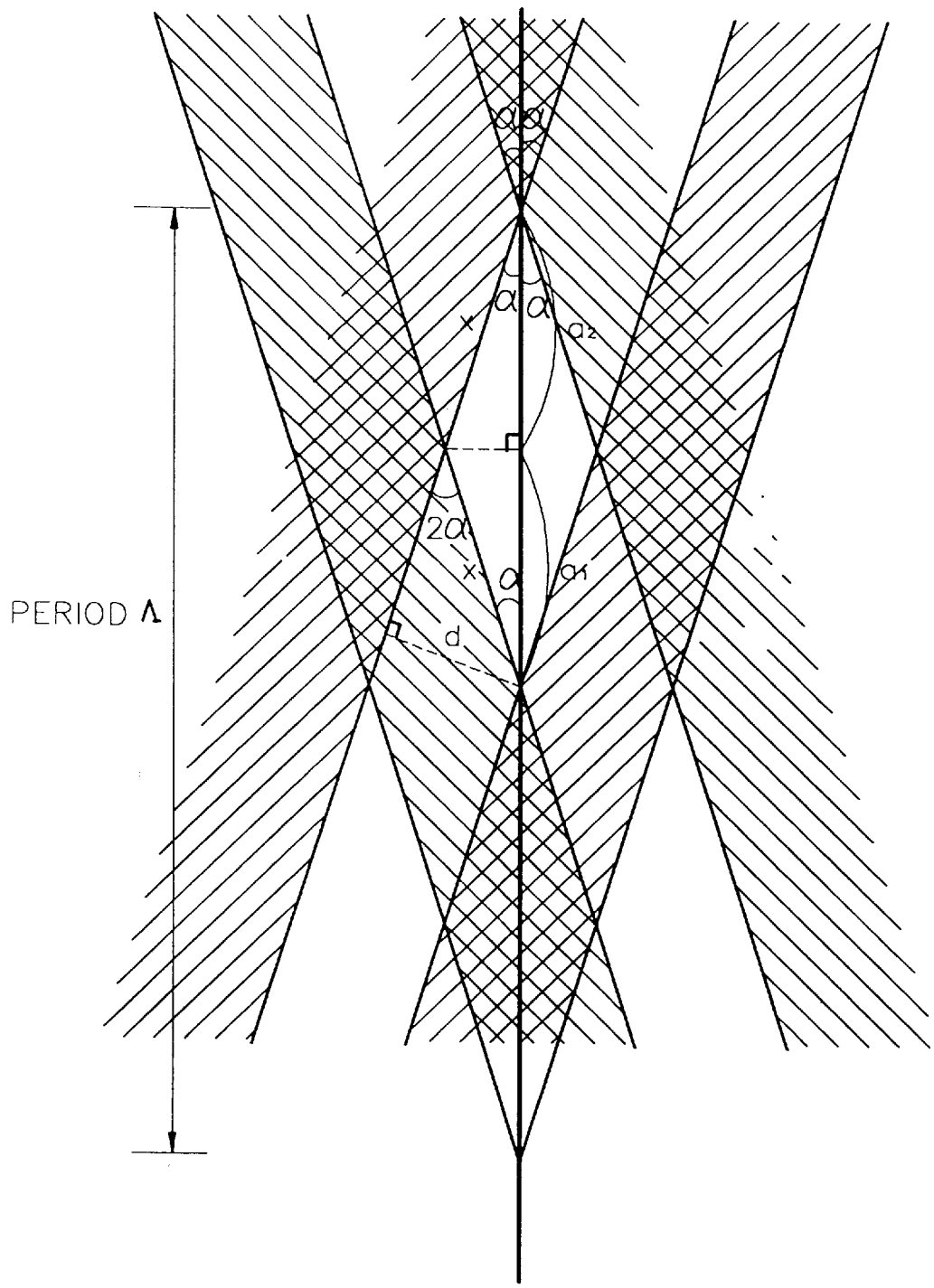
FIG. 4 shows the determination of the period of an amplitude mask according to the angle of rotation in FIG. 3.

As shown in FIG. 4, the amplitude mask period $\Lambda$ is determined with respect to the angle of rotation ($\alpha$), as follows:

$$x\cos\alpha = a_1 = a_2 \quad (2)$$
$$x\sin 2\alpha = d$$
$$a_1 = \frac{d\cos\alpha}{\sin 2\alpha}$$
$$2d = \Lambda_0$$
$$\Lambda = \frac{2\Lambda_0 \cos\alpha}{\sin 2\alpha}$$

wherein $\Lambda_0$ is the period of a mask.

Figure 5:
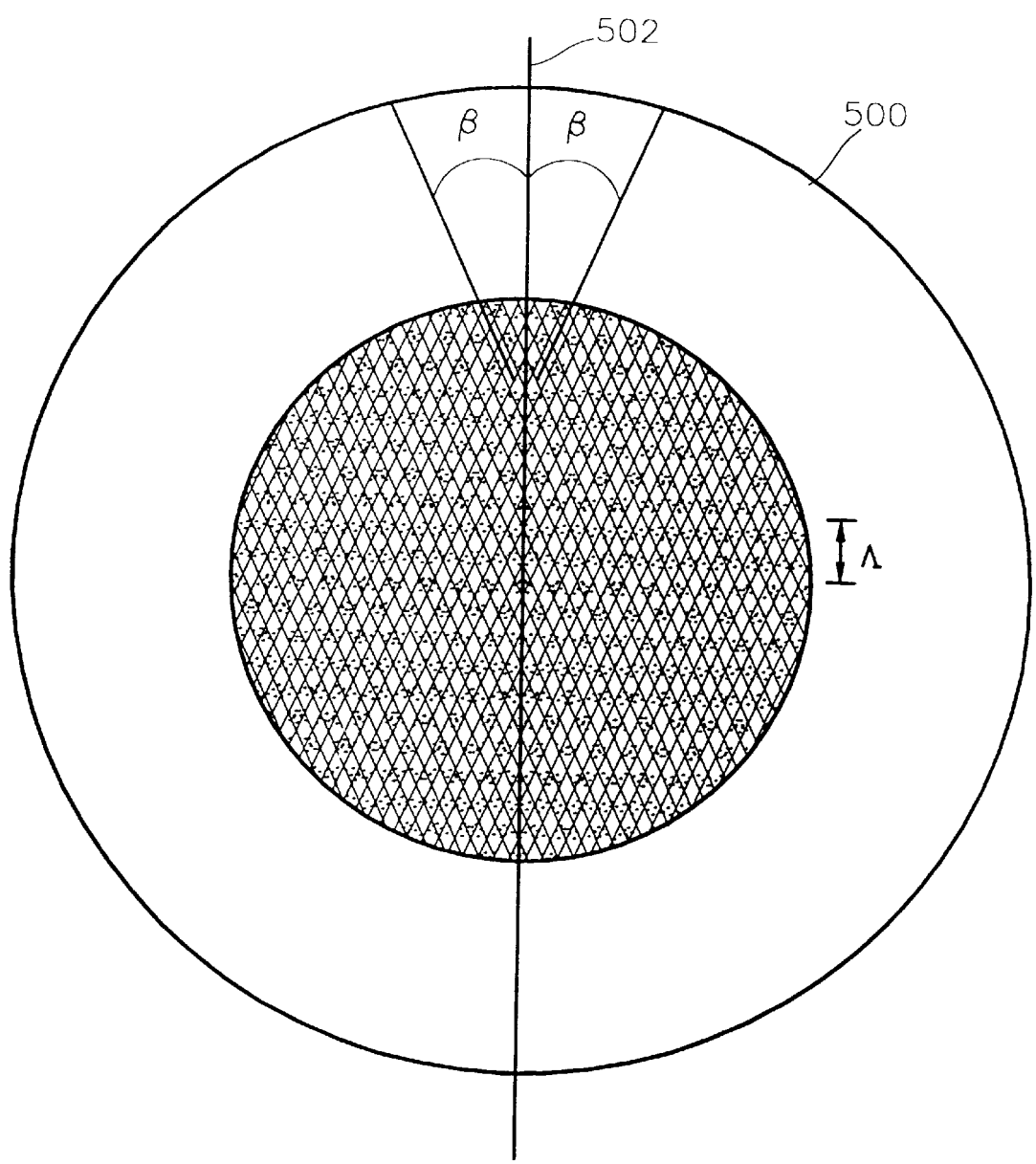
FIG. 5 illustrates two masks rotated by a larger angle than in FIG. 3.
Figure 6:
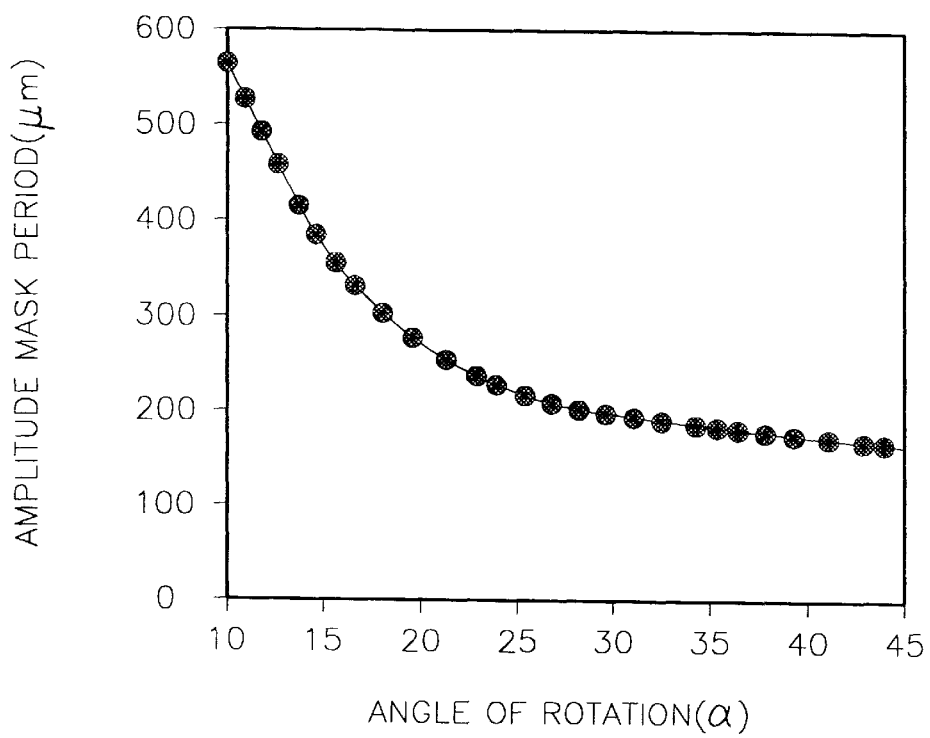
FIG. 6 is a graph showing the variation of the period of an amplitude mask depending on the angle of rotation ($\alpha$) when a mask having a period $\Lambda_0$ of 100 $\mu$m is used.

FIG. 5 shows two masks 500 rotated by $\beta$ that is larger than the rotating angle ($\alpha°$) of FIG. 3. Here, reference numeral 502 is the direction of an optical fiber or an optical waveguide. It can be seen that the period of the amplitude mask becomes smaller as the rotating angle becomes larger than in FIG. 3. FIG. 6 is a graph showing a variation of the grating period of an amplitude mask depending on a rotating angle ($\alpha$) when a mask having a period $\Lambda_0$ of 100 $\mu$m is used. Referring to FIG. 6, the grating period of the amplitude mask can be continuously controlled from 140 $\mu$m, through 600 $\mu$m at an angle of rotation of 10°, to over 600 $\mu$m (when $\alpha$ is 0°, the period is infinite).

Figure 7:
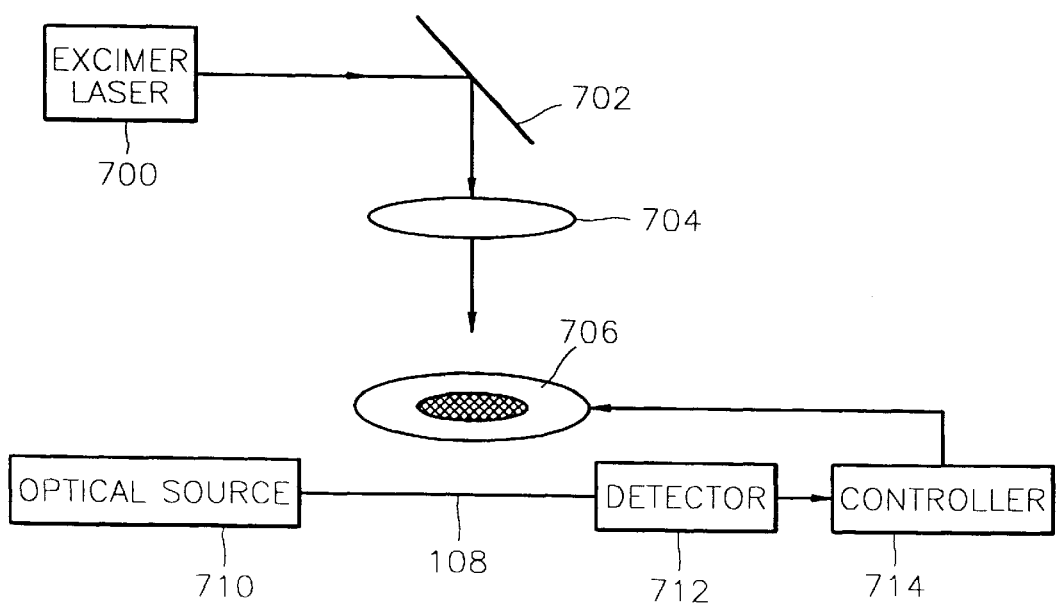
FIG. 7 is a block diagram schematically illustrating a long period grating filter manufacturing apparatus using an amplitude mask portion, according to the present invention.

FIG. 7 is a block diagram schematically illustrating a long period grating filter manufacturing apparatus using an amplitude mask portion, according to the present invention. Referring to FIG. 7, the long period grating filter manufacturing apparatus includes an excimer laser optical source 700, a mirror 702, a lens 704, an amplitude mask portion 706, an optical fiber 708, an optical source 710, a detector 712, and a controller 714. The mirror 702 changes the path of laser light emitted by the excimer laser optical source 700. The lens 704 adjusts the focus of laser light whose path is changed by the mirror 702. The amplitude mask portion 706 selectively passes the laser light passed through the lens, and is comprised of two masks of FIG. 2 which are fixed, being overlapped on a rotation jig (not shown), and then each accurately rotated. The optical fiber 708 has a core in which a long period grating is formed by being irradiated by laser light passed through the amplitude mask 706. The detector 712 detects the optical characteristics passed through the optical fiber 708 on which the long period grating has been formed. The controller 714 controls the period of the amplitude mask portion 706 according to a coupling peak which is detected by the detector 712.

Here, the coupling peak means that an extinction ratio becomes maximum since a core mode of each wavelength is coupled to a cladding mode in a long period grating.

Manufacture of the long period grating filter using the long period grating filter manufacturing apparatus will now be described. First, laser light generated by the excimer laser optical source 700 is irradiated to the optical fiber 708 contacting the amplitude mask portion 706, via the mirror 702 and the lens 704. The refractive index of a portion of the optical fiber irradiated by laser light passed through the amplitude mask portion 706 is changed to thus form a long period grating. At this time, the optical fiber 708 in which the long period grating has been formed passes light generated by the optical source 710, and the detector 712 detects the intensity and wavelength of the light passed through the optical fiber 708. The controller 714 controls the period of the amplitude mask to obtain a desired coupling peak wavelength from the optical fiber 708.

In the amplitude mask according to the present invention, two masks each having a regular period are rotated in opposite directions, so that it has a period depending on the angle of rotation. Thus, the period of the amplitude mask can be continuously changed. Also, when manufacturing the long period grating filter, an amplitude mask whose period is adjustable is adopted instead of a silica mask having only one period, thus a coupling peak wavelength that is sensitive to the period can be obtained.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. An amplitude mask for periodically passing laser light to an optical fiber when a long period grating is manufactured by selectively passing the laser light to the optical fiber, comprising:
    two masks having periodically alternating pass areas for passing the laser light and nonpass areas for preventing passing of the laser light; and
    the two masks being rotatable over a continuous range in opposite directions such that the period of the pass area may be varied over a continuous range.

2. The amplitude mask as claimed in claim 1, the substrate material of each mask comprising a metal.

3. The amplitude mask as claimed in claim 1, the period ($\Lambda$) of the amplitude mask being determined by the equation:

$$\Lambda = \frac{2\Lambda_0 \cos\alpha}{\sin 2\alpha}$$

wherein $\Lambda_0$ is the period of the mask, and $\alpha$ is the angle of rotation of the two masks.

4. A long period grating filter manufacturing apparatus comprising:
    a laser optical source for emitting laser light;
    an amplitude mask portion whose period is controlled by overlapping two masks each having a predetermined period and rotating the two overlapped masks a predetermined angle, and which selectively passes the laser light to an optical fiber in which a long period grating is to be formed, according to the predetermined period; and
    a rotator for rotating the two masks a predetermined angle in opposite directions.

5. The long period grating filter manufacturing apparatus as claimed in claim 4, further comprising:
    a second optical source;
    a detector for detecting a coupling peak of the long period grating filter from one of two ends of an optical fiber in which a long period grating has been formed, when light generated by the second optical source is incident upon the other of two ends of the optical fiber in which the long period grating has been formed; and
    a controller for controlling the rotator to obtain a desired coupling peak wavelength by receiving a wavelength at the coupling peak from the detector.

6. The long period grating filter manufacturing apparatus as claimed in claim 4, the substrate material of each mask comprising a metal.

7. The long period grating filter manufacturing apparatus as claimed in claim 5, the period ($\Lambda$) of the amplitude mask being determined as follows:

$$\Lambda = \frac{2\Lambda_0 \cos\alpha}{\sin 2\alpha}$$

wherein $\Lambda_0$ is the period of the mask, and $\alpha$ is the angle of rotation of the mask.

8. A long period grating filter manufacturing apparatus comprising:
    a laser optical source;
    a mirror for changing the path of laser light emitted by the laser optical source;
    a lens for adjusting the focus of laser light whose path has been changed;
    an amplitude mask portion whose period is controlled by overlapping two masks each having a predetermined period and rotating the two overlapped masks a predetermined angle, and which selectively passes the laser light passed through the lens to an optical fiber in which a long period grating is to be formed, according to the predetermined period;
    a detector for detecting a coupling peak of a long period grating filter formed on the optical fiber; and
    a controller for controlling the period of the amplitude mask to obtain a desired coupling peak wavelength by receiving a wavelength at the coupling peak from the detector.

9. A method of manufacturing a long period grating filter, comprising the steps of:
    overlapping two masks in each of which pass regions passed by laser light alternate with nonpass regions, and rotating the two masks in opposite directions;
    irradiating the laser light to an optical fiber via the pass regions formed at predetermined periods in the two rotated masks and forming a long period grating on the optical fiber; and
    measuring a coupling peak due to the long period grating by passing light through the optical fiber on which the long period grating has been formed, and controlling the angle of rotation at which the two masks are rotated so that the measured coupling peak is achieved at a desired wavelength.

* * * * *